(12) United States Patent
Cheng

(10) Patent No.: US 12,092,510 B2
(45) Date of Patent: Sep. 17, 2024

(54) WEIGHING DEVICE

(71) Applicant: CHANGXIN MEMORY TECHNOLOGIES, INC., Hefei (CN)

(72) Inventor: Jian Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 391 days.

(21) Appl. No.: 17/595,606

(22) PCT Filed: Jun. 22, 2021

(86) PCT No.: PCT/CN2021/101603
§ 371 (c)(1),
(2) Date: Nov. 19, 2021

(87) PCT Pub. No.: WO2022/048252
PCT Pub. Date: Mar. 10, 2022

(65) Prior Publication Data
US 2022/0397447 A1    Dec. 15, 2022

(30) Foreign Application Priority Data

Sep. 3, 2020   (CN) .......................... 202010914666.3

(51) Int. Cl.
*G01G 21/23*     (2006.01)
*G01G 21/28*     (2006.01)

(52) U.S. Cl.
CPC .......... *G01G 21/23* (2013.01); *G01G 21/286* (2013.01)

(58) Field of Classification Search
CPC ...... G01G 21/23; G01G 21/286; G01G 21/22; H01L 21/687

(Continued)

(56) References Cited

U.S. PATENT DOCUMENTS 8,851,816 B2 * 10/2014 Fenske .................. G01G 19/00
                                                                       414/416.03
9,004,838 B2 *  4/2015 Fenske .............. H01L 21/67288
                                                                       414/416.03

(Continued)

FOREIGN PATENT DOCUMENTS

CN        1183854 A    6/1998
CN      101728302 A    6/2010

(Continued)

OTHER PUBLICATIONS

International Search Report as cited in PCT Application No. PCT/CN2021/101603 mailed Sep. 17, 2021, 5 pages.

(Continued)

*Primary Examiner* — Jacques M Saint Surin
(74) *Attorney, Agent, or Firm* — Syncoda LLC; Feng Ma

(57) ABSTRACT

Embodiments of the present application provide a weighing device that comprises a weighing unit for weighing wafers, a support structure placed on the weighing unit, at least two support platforms disposed on the support structure and each having a bearing surface for supporting peripheral regions of the wafers, and a driving part for driving the support platforms to move on the support structure, so as to adapt the at least two support platforms to bear the differently sized wafers. Since a wafer contacts merely several support platforms, cleanness of the wafer is better maintained during the weighing process; at the same time, the support platforms are enabled to stably bear differently sized wafers through adjustment of movements of the support platforms on the support structure.

10 Claims, 3 Drawing Sheets

(58) Field of Classification Search
USPC .......................................................... 177/201
See application file for complete search history.

(56) References Cited

U.S. PATENT DOCUMENTS

| | | | |
|---|---|---|---|
| 9,791,309 B2* | 10/2017 | Fenske | H01L 21/67288 |
| 10,775,227 B2* | 9/2020 | Zhang | G01G 21/23 |
| 10,969,266 B2* | 4/2021 | Kroll | G01G 21/14 |
| 2012/0061150 A1 | 3/2012 | Coulombe et al. | |
| 2014/0262558 A1* | 9/2014 | Johnson | G01G 23/005 177/211 |
| 2017/0115158 A1* | 4/2017 | Wilby | G01G 23/10 |

FOREIGN PATENT DOCUMENTS

| | | |
|---|---|---|
| CN | 102042921 B | 7/2012 |
| CN | 102023172 B | 11/2012 |
| CN | 101728302 B | 6/2013 |
| CN | 104392952 A | 3/2015 |
| CN | 105762094 A | 7/2016 |
| CN | 205717400 U | 11/2016 |
| CN | 106328570 A | 1/2017 |
| CN | 107255509 A | 10/2017 |
| CN | 207966941 U | 10/2018 |
| CN | 108878344 A | 11/2018 |
| CN | 208271840 U | 12/2018 |
| CN | 110164813 A | 8/2019 |
| CN | 110582843 A | 12/2019 |
| CN | 110634788 A | 12/2019 |
| CN | 111048465 A | 4/2020 |
| CN | 210588600 U | 5/2020 |
| DE | 4233395 C1 | 11/1993 |
| JP | 2009095953 A | 5/2009 |
| JP | 2012089680 A | 5/2012 |
| TW | 200938814 A | 9/2009 |
| TW | 201523737 A | 6/2015 |
| TW | 201543008 A | 11/2015 |
| TW | 201937648 A | 9/2019 |

OTHER PUBLICATIONS

MedPeer, Scientific research essential "weapon"—electronic analytical balance, Jul. 24, 2019, https://www.sohu.com/a/329025210_120100109, 9 pages.

Second Office Action of the Chinese application No. 202010914666.3, issued on Nov. 15, 2022, 19 pages.

Written Opinion in cited PCT/CN2021/101603, mailed on Sep. 17, 2021, 6 pages.

* cited by examiner

WEIGHING DEVICE

CROSS-REFERENCE TO RELATED APPLICATIONS

The present application is based on and claims the right of priority of the Chinese patent application number 202010914666.3, and filed on Sep. 3, 2020, the entire contents of which are herein incorporated by reference.

TECHNICAL FIELD

Embodiments of the present application relate to the field of semiconductors, and more particularly to a weighing device.

BACKGROUND

The weighing device is used in several processing techniques in semiconductor fabrication field to judge the qualities of the processes—for example, in the cleaning process, cleaning degree and cleaning efficiency are judged through difference in weights of a wafer both before and after the cleaning as weighed by a weighing device; for another example, in the process of producing doped metal ion films, the weight of a film is obtained by weighing the difference in weights of a wafer both before and after growth of the film, and this weight of the film serves as an important parameter to detect the mass percentage of the doped metal ions.

However, it is currently problematic due to inferior precision of weighing results during the process of weighing wafers.

SUMMARY

The technical problem to be solved by the embodiments of the present application is to provide a weighing device so as to solve the problem of inferior precision of wafer weights during the process of weighing wafers.

In order to solve this problem, the present application provides a weighing device that comprises a weighing unit for weighing wafers, a support structure placed on the weighing unit, at least two support platforms disposed on the support structure and each having a bearing surface for supporting peripheral regions of the wafers, and a driving part for driving the support platforms to move on the support structure, so as to adapt the at least two support platforms to bear the differently sized wafers.

BRIEF DESCRIPTION OF DRAWINGS

One or more embodiment(s) is/are exemplarily illustrated through corresponding figure(s) in the accompanying drawings. These exemplary illustrations do not constitute any restriction to the embodiments. Unless otherwise specified, figures in the accompanying drawings do not constitute any restriction as to scale.

DESCRIPTION OF EMBODIMENTS

Figure 1:
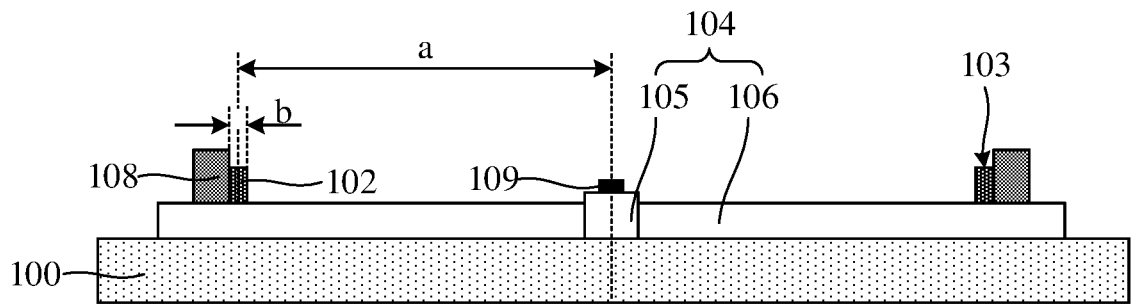
FIG. 1 is a schematic connection diagram of an output circuit according to an embodiment of the present invention.

As can be known from the Background of the Related Art, there is currently a problem in which weighing results are inferior in precision during the process of weighing wafers.

The main reasons for causing inferior precision are analyzed to include the following. As the cleanness of a wafer is closely related to the performance of the semiconductor device, in order to avoid contamination of the wafer during the weighing process, it is modus operandi to reduce the area of contact between the weighing device and the wafer; however, with the increase in dimensional size of the wafer, an unduly small contact area would make it difficult for the wafer to be stably placed, thereby affecting the reproducibility and precision of the wafer weight; when stability and precision for weighing differently sized wafers are to be enhanced by increasing the contact area, cleanness of the wafers will be adversely affected. Accordingly, currently available weighing devices are not suitable for weighing differently sized wafers, as they are problematic in terms of inferior precision and low cleanness.

In order to solve the above problem, embodiments of the present application provide a weighing device whose support platforms are employed to support peripheral regions of wafers, and are moveable on the support structure when driven by a driving part. Thus, when different wafers are weighed, positions of the support platforms are adjusted according to sizes and dimensions of the wafers, whereby the wafers can be stabilized, and precision of weighing results can be enhanced.

To make the objectives, technical solutions and advantages of the present application more clear, embodiments of the present application are described in detail below with reference to the accompanying drawings. As comprehensible to persons ordinarily skilled in the art, many technical details are enunciated in the embodiments of the present application for readers to better understand the present application. However, the technical solution to be protected by the present application can still be realized even in the absence of these technical details and various modifications and amendments makeable on the basis of the embodiments.

The first embodiment of the present application provides a weighing device, whose structure is schematically shown in FIGS. 1-5.

Referring to FIGS. 1-5, in this embodiment, the weighing device comprises a weighing unit 100 for weighing a wafer 101, a support structure 104 placed on the weighing unit 100, at least two support platforms 102 disposed on the support structure 104 and each having a bearing surface 103 for supporting the peripheral region of the wafer 101, and a driving part 108 for driving the support platforms 102 to move on the support structure 104, so as to adapt the at least two support platforms 102 to bear differently sized wafers 101.

The specific embodiment of a weighing device provided by the present application is described in detail below with reference to the accompanying drawings.

Figure 2:
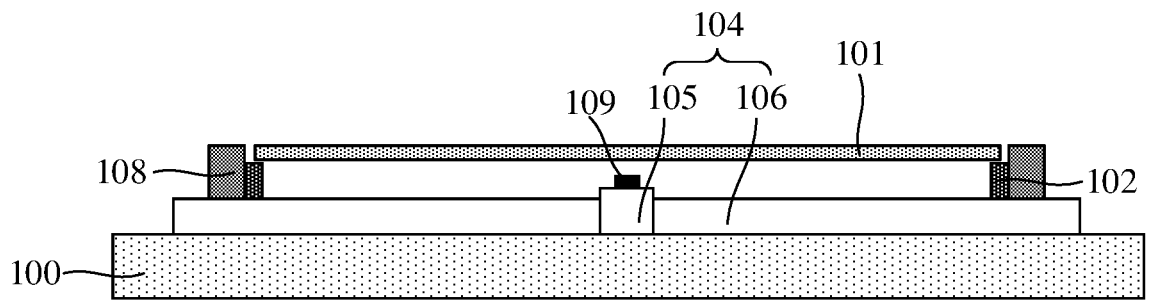
FIG. 2 is a front view of the weighing device weighing a wafer as provided by the first embodiment.

Referring to FIG. 1 and FIG. 2 together, the weighing unit 100 is employed to weigh the wafer 101, and the weighing unit 100 can be an analytical balance.

The bearing surface 103 of the support platform 102 is utilized to support the peripheral region of the wafer 101. Since the periphery of the wafer 101 is less used than the central region thereof when the wafer is finally cut and packaged, even if the periphery of the wafer 101 is damaged or contaminated by the support platform 102, this would not affect the overall acceptance rate of the final product.

There should be at least two support platforms 102, and there are three support platforms 102 in this embodiment. The three support platforms 102 can stably bear the wafer 101 and prevent the wafer 101 from being sliding down, and fix the wafer 101 in position with relatively small contact areas, so as to reduce contamination of the wafer 101 due to direct contact as far as possible. In other embodiments, the weighing device may as well be provided with two support platforms, or four or more than four support platforms.

During the process of bearing the wafer 101, the distances of the plural support platforms 102 to the central axis of the wafer 101 are equal, so that the wafer 101 is uniformly forced upon and stably placed. The width b of a support platform 102 along the radial direction of the wafer 101 is 5 mm, and such a relatively small width can reduce the area of contact between the support platform 102 and the wafer 101, and enhance cleanness of the wafer 101.

The support platform 102 can be packaged at the outside with a detachable synthetic resin material, to lower the possibility of scratching and damaging the wafer 101 upon contact with the support platform 102.

The support structure 104 includes a central platform 105 and a plurality of brackets 106. The central platform 105 is connected with one ends of the plural brackets 106, the support platforms 102 are located on the brackets 106, and each support platform 102 is disposed on one bracket 106; moreover, the support platforms 102 are adapted to move along extension direction of the brackets 106. When the wafer 101 is weighed, the distances of the plural support platforms 102 to the central platform 105 are equal.

The central platform 105 and the brackets 106 are of low weight, so the support structure 104 as a whole is relatively low in weight; the weighing unit 100 pertains to a precise instrument with a small measuring range; as the support structure 104 is relatively low in weight, even if a large-sized wafer 101 is weighed, the total weight of the wafer 101 and the support structure 104 will not exceed the measuring range of the weighing unit 100. In other embodiments, the support structure can be embodied to be such a structure as a disc or a round table.

The central platform 105 is located at the central axis of the support structure 104, and the central axis of the support structure 104 coincides with the central axis of the weighing unit 100, so the central platform 105 is located at the central axis of the weighing unit 100. Since the central platform 105 is further located at the central axis of the wafer 101, so the center of the wafer 101 coincides with the central axis of the weighing unit 100. Thusly, the position where the wafer 101 is weighed at each time can be fixed, thereby enhancing the precision and reproducibility of the weighing result.

The upper surface of the central platform 105 is lower than the bearing surface 103, and a difference in height between the upper surface of the central platform 105 and the bearing surface 103 is greater than 5 mm Since the wafer 101 possesses certain plasticity, when several support platforms 102 support one wafer 101, the central region of the wafer 101 will be lower than its peripheral region, so the height of a support platform 102 should be at least 5 mm greater than the central platform 105, so as to prevent the wafer 101 from directly contacting the central platform 105 during the weighing process, to thereby reduce the contact area, and to guarantee cleanness of the wafer 101.

Further, the upper surface of the bracket 106 is lower than the upper surface of the central platform 105, whereby is avoided that the wafer 101 should be in contact with the upper surface of the bracket 106 during the weighing process. Therefore, the wafer 101 contacts only the support platforms 102, and such small areas of contact ensure high cleanness of the wafer.

Since there are three support platforms 102 in this embodiment, the number of brackets 106 is correspondingly three. In other embodiments, the weighing device can also be provided with two brackets, or four or more than four brackets.

Included angles between adjacent brackets 106 are equal, thus, the wafer 101 can be more uniformly forced upon to ensure stability in the weighing process.

The extension direction of the brackets 106 is parallel to the upper surface of the weighing unit 100, thus, the support structure 104 as a whole has a relatively low center of gravity, and the stability of the support structure 104 is so quite well as to ensure stable placement of the wafer 101.

In this embodiment, the lower surface of the bracket 106 is flush with the lower surface of the central platform 105; thus, when the support structure 104 is being placed on the weighing unit 100, the bracket 106 and the central platform 105 both come into contact with the weighing unit 100, the entire support structure 104 and the weighing unit 100 keep a relatively large contact area, and this helps enhance stable placement of the support structure 104, thereby further enhancing stability of the wafer 101 during the weighing process. In other embodiments, the lower surface of the bracket can also not be flush with the lower surface of the central platform, in which case only the lower surface of the central platform comes into contact with the weighing unit when the entire support structure is being placed on the weighing unit.

The weighing device further comprises a first range sensor 109 for measuring distance between the support platform 102 and the central axis of the support structure 104.

Specifically, during the process in which the support platform 102 moves along the bracket 106, the first range sensor 109 measures in real time the distance between the support platform 102 and the central axis of the support structure 104, so as to ensure that the support platform 102 moves to a preset position.

During the process of weighing differently sized wafers 101, when the first range sensor 109 measures the distance between the support platform 102 to the central axis of the support structure 104 to be a preset distance a, the driving part 108 stops driving the support platform 102 for movement, and the preset distance a is the radius of the wafer 101 to be weighed. For instance, when a wafer 101 of 12 cuns (a Chinese unit of length equal to one-third decimeter) is weighed, the preset distance between the support platform 102 and the central axis of the support structure 104 is 6 cuns, and when the first range sensor 109 measures the distance between the support platform 102 and the central axis of the support structure 104 to be 6 cuns, the support platform 102 stops moving. Thusly, it is possible through the first range sensor 109 to precisely measure the distance between the support platform 102 and the central axis of the support structure 104, and to hence precisely adjust the distance between the support platform 102 and the central axis of the support structure 104, so as to stably weigh differently sized wafers 101.

The first range sensor 109 is disposed at the central axis of the support structure 104; in this embodiment, the first range sensor 109 is disposed at the central platform 105. In other embodiments, it can be disposed at the support platform.

Figure 3:
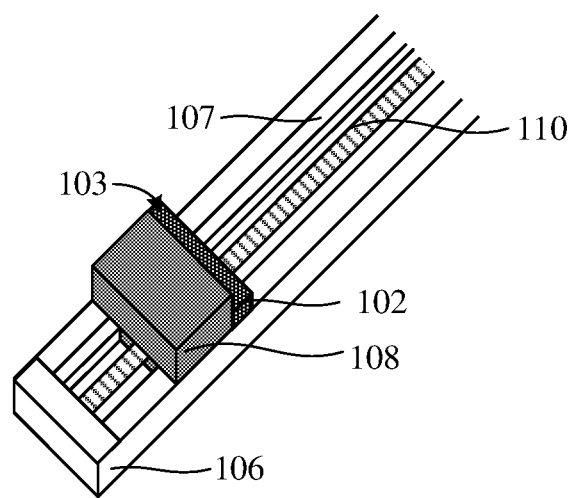
FIG. 3 is a view showing part of the weighing device provided by the first embodiment.

Referring to FIG. 3, the support structure 104 (also refer to FIGS. 1 and 2) is provided thereon with a guide rail 107, and the driving part 108 drives the support platform 102 to move along the guide rail 107, so that the support platform 102 moves on the support structure 104.

The weighing device further comprises a controller (not shown) connected with the driving part 108 to hence control the support platform 102 to move on the guide rail 107.

In this embodiment, the guide rail 107 is further provided therein a horizontal ball screw 110, the horizontal ball screw 110 is connected to a servo motor (not shown), the servo motor drives the horizontal ball screw 110 to rotate, and the servo motor is further under control of the controller. Horizontal ball screws 110 in plural guide rails 107 are driven by a bevel gear on the same and single servo motor, thus maintaining synchronous actions of plural driving parts 108, and hence ensuring synchronous actions of plural support platforms 102, whereby the wafer 101 (refer to FIGS. 1 and 2) is uniformly forced upon, and stably placed.

The driving part 108 includes a slide block, the slide block is connected with the horizontal ball screw 110, when the servo motor drives the horizontal ball screw 110 to rotate, the slide block will be changed to a linear motion with the rotation angle of the horizontal ball screw 110.

The driving part 108 is connected with the support platform 102, and moves synchronously with the support platform 102. The height of the driving part 108 is greater than the height of the support platform 102, and the driving part 108 is more close to the edge of the bracket 106 as compared with the support platform 102; thus, during the weighing process, the driving part 108 is located at the periphery of the edge of the wafer 101, and is higher than the wafer 101, so that plural driving parts 108 can engage the wafer 101 onto the support platform 102 and prevent the wafer 101 from being sliding down the support platform 102, thereby guaranteeing stability during the weighing process.

The weighing device further comprises a lifting part (not shown) for driving the support platforms 102 to lift up and down, so as to adjust distance between the bearing surface 103 and the upper surface of the weighing unit 100 (refer to FIG. 1). The controller is further connected to the lifting part to control the lifting up and down of the lifting part.

Specifically, each support platform 102 is connected with one lifting part, and the controller controls the lifting up and down of each lifting part, so that the support platform 102 can be independently controlled. During the weighing process, the controller controls all support platforms 102 to be located at a consistent height, so as to fix the height of the wafer 101 each time it is weighed, thereby enhancing weighing precision and reproducibility.

Figure 4:
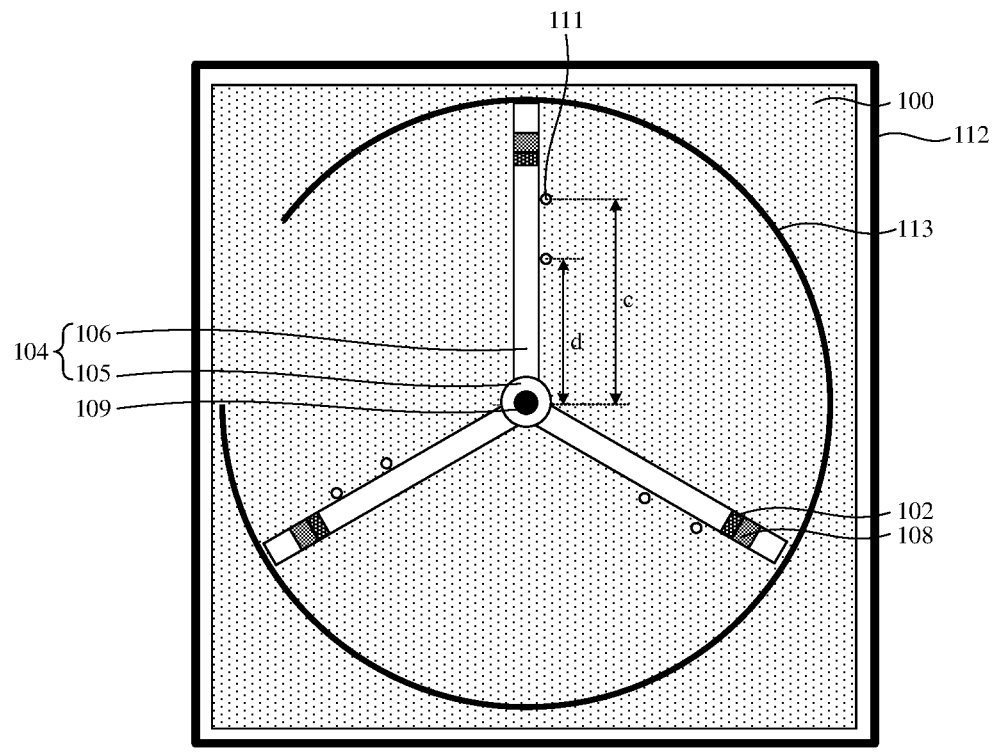
FIG. 4 is a vertical view of the weighing device provided by the first embodiment.
Figure 5:
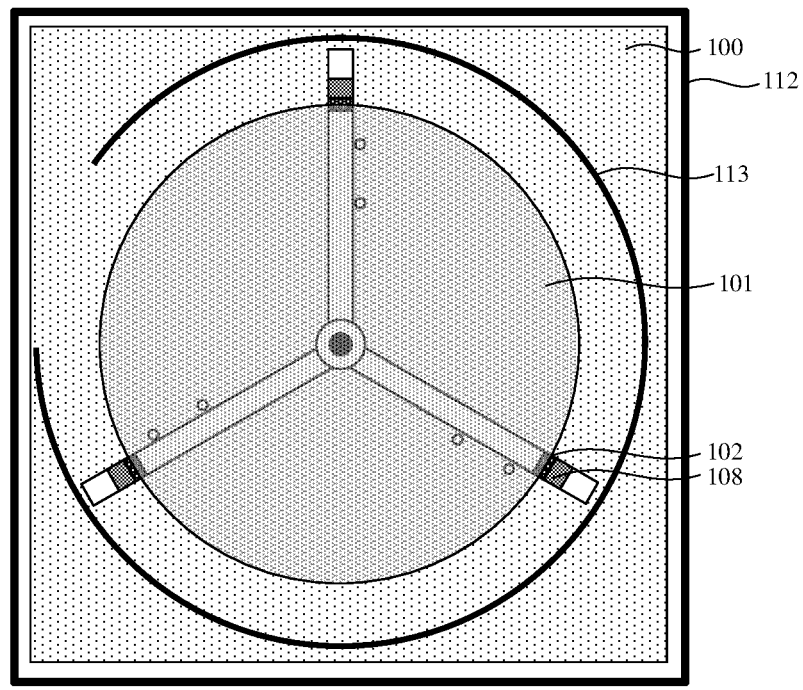
FIG. 5 is a vertical view of the weighing device weighing a wafer as provided by the first embodiment.

Referring to FIGS. 4 and 5 together, the weighing device further comprises a second range sensor 111 disposed on the upper surface of the weighing unit 100 for measuring distance between the bearing surface 103 and the upper surface of the weighing unit 100.

In this embodiment, the distance between some second range sensors 111 and the central axis of the support structure 104 is a first distance c, the distance between some second range sensors 111 and the central axis of the support structure 104 is a second distance d, and the first distance c is greater than the second distance d. In one example, the first distance c is 195 mm-190 mm, and the second distance d is 128 mm-123 mm.

When a wafer 101 having a first diameter is weighed, the second range sensor 111 whose distance to the central axis of the support structure 104 is the first distance c is started; when a wafer 101 having a second diameter is weighed, the second range sensor 111 whose distance to the central axis of the support structure 104 is the second distance d is started, the second diameter is less than the first diameter. If the difference of distances between every two of plural second range sensors 111 is within a preset differential threshold, the weighing process is started, and the preset differential threshold is 1 mm; if the difference of distances is greater than the preset differential threshold, the controller starts one or more of the plural lifting parts, so that the height(s) of one or more of the plural support platforms 102 is/are raised or lowered, thus that a difference of heights of all support platforms 102 is within the range of the preset differential threshold, the second range sensors 111 are restarted after the adjustment, the measured distance information is fed back to the controller, the difference of distances among the second range sensors 111 is judged again, and the weighing process is started if the difference rests within the preset differential threshold. Thusly, it is guaranteed that all support platforms 102 are at a consistent height before weighing, and this in turn ensures that wafers 101 weighed at each time can be maintained relatively consistently, thus enhancing weighing stability and reproducibility.

In other embodiments, it is possible to change the distance of the second range sensors to the central axis of the support structure according to the sizes and dimensions of the wafers, and also possible to increase or decrease the number of the second range sensors.

The weighing device further comprises a wind shield 112 disposed at periphery of the weighing unit 100. The wind shield 112 is employed to fend off disturbing wind from the outside, so as to enhance weighing stability. The wind shield in this embodiment includes glass or transparent plastic, so as to facilitate monitor/control and operation during the weighing process.

The weighing device further comprises a protective shield 113 disposed at periphery of the support structure 104. The distance from the protective shield 113 to the edge of the support structure 104 is 1 cm, and the protective shield 113 is at least 1 cm higher than the bearing surface 103. Since the wafer 101 is relatively large-sized, levelness for placing the wafer 101 tends to be affected by disturbing wind at the bottom, so the provision of a protective shield 113 can prevent disturbing wind from fleeting in the bottom of the wafer 101 being weighed. Therefore, the protective shield 113 can further enhance weighing stability.

The protective shield 113 in this embodiment is circular as viewed in a vertical view, and the circular protective shield 113 coincides with the shape of the wafer 101; during the process when the wafer 101 is being placed into the weighing device, the circular protective shield 113 can help locate the wafer 101, so that the wafer 101 can be quickly and precisely placed on the support structure 104. The circular protective shield 113 is provided thereon with an opening whose central angle is 30°, so as to facilitate wafer tip or wafer robot arm to absorb and grab the wafer 101 to be weighed for placement onto the support structure 104. In other embodiments, the protective shield may also be rectangular as viewed in a vertical view.

The weighing device further comprises a display screen (not shown) that is manipulated to control the weighing process.

To sum it up, the distance of movement of the support platform 102 on the support structure 104 can be adjusted, so that the support platform 102 is adapted to weigh differently sized wafers 101; at the same time, the distance between the bearing surface 103 of the support platform 102 and the weighing unit 100 can also be adjusted, so that wafers 101 are located at a relatively consistent height; moreover, during the weighing process, the wafer 101 comes into contact only with the support platform 102. Accordingly, the weighing device provided by this embodiment can enhance stability and precision of weighing result while guarantee cleanness of the wafer 101.

Figure 6:
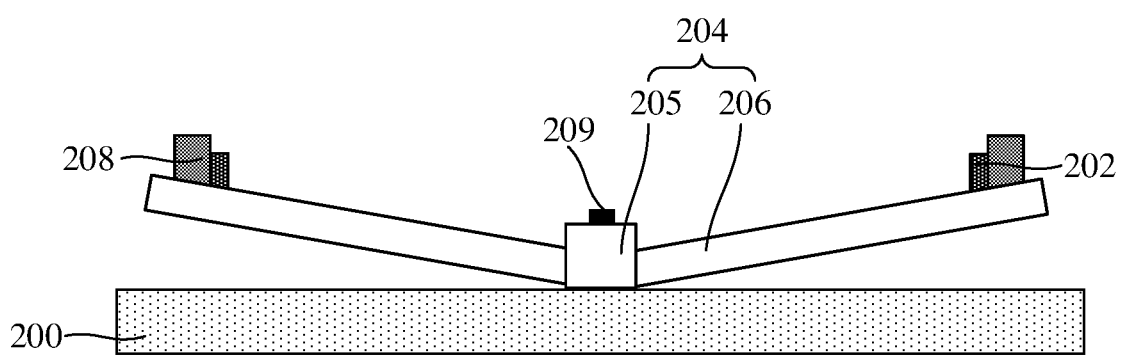
FIG. 6 is a front view of the weighing device provided by the second embodiment.
Figure 7:
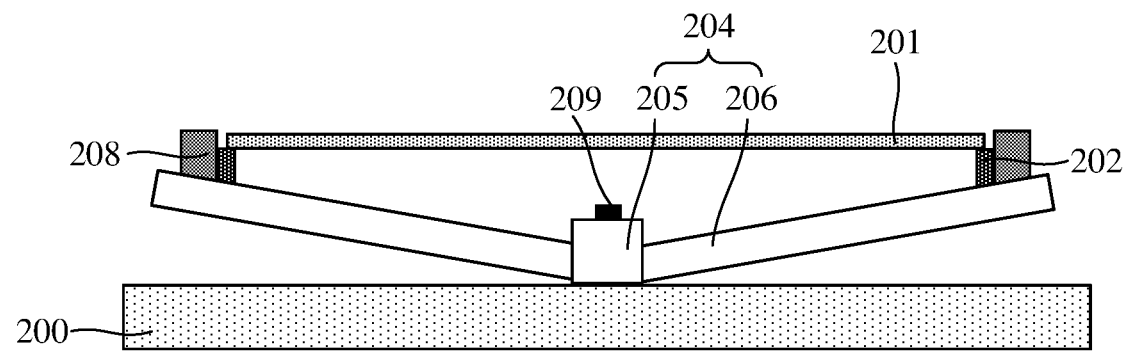
FIG. 7 is a front view of the weighing device weighing a wafer as provided by the second embodiment.

The second embodiment of the present application provides a weighing device. FIG. 6 is a front view of this weighing device, and FIG. 7 is a front view of this weighing device weighing a wafer. The weighing device provided by this embodiment comprises a weighing unit 200, a support platform 202, a support structure 204, a driving part 208, and a first range sensor 209. The weighing device provided by this embodiment is generally consistent with the weighing device provided by the first embodiment, and differs from the latter mainly as follows: the extension direction of the brackets 206 of the support structure 204 in this embodiment is inclined relative to the upper surface of the weighing unit 200, and the weighing device in this embodiment is not provided with any lifting part.

Detailed description is made below with reference to the accompanying drawings. Please refer to the detailed description of the first embodiment for structures identical with or similar thereto, while no repetition is made in this context.

Referring to FIG. 6, the support structure 204 provided by this embodiment includes a central platform 205 and plural brackets 206, and the extension direction of the brackets 206 is inclined relative to the upper surface of the weighing unit 200.

The support platform 202 moves along the extension direction of the brackets 206, and it is possible not only to adjust the distance between the support platform 202 and the central axis of the support structure 204, but also to adjust the distance between the bearing surface 203 of the support platform 202 and the upper surface of the weighing unit 200. Therefore, no lifting part is required in this embodiment.

Correspondingly, plural driving parts 208 are connected with different servo motors (not shown), so that each driving part 208 can be independently controlled, and hence each support platform 202 is independently controlled.

The first range sensor 209 is disposed at the central axis of the support structure 204, and in this embodiment the first range sensor 209 is located at the central platform 205. The first range sensor 209 measures in real time the distance slid by the support platform 202 along the bracket 206. Since the bracket 206 is fixed in angle relative to the weighing unit 200, so the distance between the support platform 202 and the central axis of the support structure 204 and the distance between the bearing surface 203 of the support platform 202 and the upper surface of the weighing unit 200 can be converted from this angle and the distance slid by the support platform 202 along the bracket 206. When the distance between the support platform 202 and the central axis of the support structure 204 and the distance between the bearing surface 203 of the support platform 202 and the upper surface of the weighing unit 200 all satisfy the preset condition, the servo motor is stopped, so that the support platform 202 moves to a preset position.

In other embodiments, the first range sensor can also measure in real time the distance between the support platform and the central axis of the support structure. Correspondingly, a second range sensor is added to be located on the upper surface of the weighing unit, and the second range sensor is employed to measure the distance between the upper surface of the weighing unit and the bearing surface of the support platform. When the distances measured by the first range sensor and the second range sensor all satisfy the preset condition, the servo motor is stopped.

Since the extension direction of the bracket 206 in this embodiment is inclined relative to the upper surface of the weighing unit 200, the center of gravity of the entire support structure 204 is higher than the center of gravity of the support structure 204 in the first embodiment, in order to enhance stability of the support structure 204, weight and volume of the central platform 205 are correspondingly increased.

As can be understood, in other embodiments, the driving parts may also be connected to the same and single servo motor, so that the support platforms make synchronous motions along the brackets. Correspondingly, each support platform is additionally equipped with a lifting part, and the distance between the bearing surface of each support platform and the upper surface of the weighing unit is adjusted, so that all support platforms are located at a relatively consistent height, whereby wafers are maintained at the relatively consistent height.

In summary, in this embodiment the support platform 202 makes motion on the inclined bracket 206, so as to adjust the distance between the support platform 202 and the central axis of the support structure 204 as well as the distance between the bearing surface 203 and the upper surface of the weighing unit 200, so that the weighing device is adapted to weigh differently sized wafers 201, and it is guaranteed at the same time that the wafers 201 are located at a relatively consistent height while being weighed, thereby enhancing the precision of results of the same and single weighing device that weighs differently sized wafers 201.

As comprehensible to persons ordinarily skilled in the art, the aforementioned embodiments are specific examples for realizing the present application, whereas these embodiments may be variously modified both in form and in detail during actual application without departing from the spirit and scope of the present application. Any person skilled in the art may make various modifications and amendments without departing from the spirit and scope of the present application, accordingly, the protection scope of the present application shall be based on the scope defined by the attached Claims.

What is claimed is:

1. A weighing device, comprising:
   a weighing unit, for weighing wafers;
   a support structure, placed on the weighing unit;
   at least two support platforms, disposed on the support structure, and each having a bearing surface for supporting peripheral regions of the wafers;
   a first range sensor, for measuring a distance between each of the at least two support platforms and a central axis of the support structure;
   a driving part, for driving the at least two support platforms to move on the support structure, so as to adjust the distance between each of the at least two support platforms and the central axis of the support structure to weigh differently sized wafers;

a lifting part, for driving the at least two support platforms to lift up and down, so as to adjust a distance between the bearing surface and an upper surface of the weighing unit; and at least two second range sensors disposed on the upper surface of the weighing unit for measuring the distance between the bearing surface and the upper surface of the weighing unit, wherein when a difference of distances between every two of the at least two second range sensors is greater than a preset differential threshold, the lifting part drives one or more of the at least two support platforms to lift up and down, so that a height of each of the one or more of the at least two support platforms is raised or lowered, such that a difference of heights of all of the at least two support platforms is within a specified range of the preset differential threshold.

2. The weighing device according to claim 1, wherein the support structure is provided thereon with a guide rail, and the driving part drives the at least two support platforms to move along the guide rail, so that the at least two support platforms move on the support structure.

3. The weighing device according to claim 2, wherein the support structure comprises a central platform and a plurality of brackets, of which the central platform is connected with one end of each of the plurality of brackets, and each of the at least two support platforms is located on a corresponding one of the plurality of brackets; and each of the at least two support platforms is adapted to move along an extension direction of the corresponding one of the plurality of brackets.

4. The weighing device according to claim 1, wherein the support structure comprises a central platform and a plurality of brackets, of which the central platform is connected with one end of each of the plurality of brackets, and each of the at least two support platforms is located on a corresponding one of the plurality of brackets; and each of the at least two support platforms is adapted to move along an extension direction of the corresponding one of the plurality of brackets.

5. The weighing device according to claim 4, wherein an upper surface of the central platform is lower than the bearing surface, and a difference in height between the upper surface of the central platform and the bearing surface is greater than 5 mm.

6. The weighing device according to claim 4, wherein the extension direction of the plurality of brackets is parallel to the upper surface of the weighing unit, or the extension direction of the plurality of brackets is inclined relative to the upper surface of the weighing unit.

7. The weighing device according to claim 4, wherein included angles between adjacent brackets of the plurality of brackets are equal to one another.

8. The weighing device according to claim 1, wherein the central axis of the support structure coincides with a central axis of the weighing unit, and that the first range sensor is disposed at the central axis of the support structure.

9. The weighing device according to claim 1, further comprising a wind shield disposed at periphery of the weighing unit.

10. The weighing device according to claim 1, further comprising a protective shield disposed at periphery of the support structure.

* * * * *